(12) United States Patent
Kim et al.

(10) Patent No.: US 8,013,419 B2
(45) Date of Patent: Sep. 6, 2011

(54) STRUCTURE AND METHOD TO FORM DUAL SILICIDE E-FUSE

(75) Inventors: Deok-Kee Kim, Bedford Hills, NY (US); Ahmet S Ozcan, Pleasantville, NY (US); Haining S Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 12/136,246

(22) Filed: Jun. 10, 2008

(65) Prior Publication Data

US 2009/0302417 A1    Dec. 10, 2009

(51) Int. Cl.
*H01L 23/52* (2006.01)
(52) U.S. Cl. ...................................................... 257/529
(58) Field of Classification Search .................... 257/529
See application file for complete search history.

(56) References Cited

U.S. PATENT DOCUMENTS

| | | | | |
|---|---|---|---|---|
| 5,264,725 A * | 11/1993 | Mullarkey et al. | ............. | 257/665 |
| 5,708,291 A * | 1/1998 | Bohr et al. | ................... | 257/529 |
| 5,747,868 A * | 5/1998 | Reddy et al. | ................... | 257/529 |
| 6,031,275 A * | 2/2000 | Kalnitsky et al. | ............. | 257/530 |
| 6,770,948 B2 * | 8/2004 | Ito et al. | ...................... | 257/529 |
| 7,211,843 B2 * | 5/2007 | Low et al. | .................... | 257/209 |
| 7,244,985 B2 | 7/2007 | Huang et al. | | |
| 7,656,005 B2 * | 2/2010 | Booth et al. | ................... | 257/529 |
| 7,772,680 B2 * | 8/2010 | Manning | ...................... | 257/665 |
| 2005/0212080 A1 * | 9/2005 | Wu et al. | ....................... | 257/529 |
| 2006/0081959 A1 * | 4/2006 | Dondero et al. | ............. | 257/529 |
| 2006/0197179 A1 * | 9/2006 | Park et al. | .................... | 257/529 |
| 2007/0210411 A1 * | 9/2007 | Hovis et al. | ................... | 257/529 |
| 2007/0210413 A1 * | 9/2007 | Booth et al. | ................... | 257/529 |
| 2007/0262413 A1 * | 11/2007 | Booth et al. | ................... | 257/529 |
| 2008/0029843 A1 | 2/2008 | Booth, Jr. et al. | | |
| 2008/0050903 A1 | 2/2008 | Booth, Jr. et al. | | |
| 2008/0217733 A1 * | 9/2008 | Iyer et al. | ..................... | 257/529 |
| 2008/0308900 A1 * | 12/2008 | Kim et al. | .................... | 257/529 |
| 2009/0057818 A1 * | 3/2009 | Kim et al. | .................... | 257/529 |
| 2009/0108396 A1 * | 4/2009 | Chidambarrao et al. | ..... | 257/529 |
| 2010/0038747 A1 * | 2/2010 | Chanda et al. | ................ | 257/529 |

* cited by examiner

*Primary Examiner* — N Drew Richards
*Assistant Examiner* — Grant S Withers
(74) *Attorney, Agent, or Firm* — Gibb I.P. Law Firm, LLC; Joseph Petrokaitis, Esq.

(57) ABSTRACT

An e-fuse structure and method has anode, a fuse link, and a cathode. The first end of the fuse link is connected to the anode and the second end of the fuse link opposite the first end is connected to the cathode. This structure also includes a first silicide layer on the anode and the fuse link and a second silicide layer, different than the first silicide layer, on the cathode. The difference between the first silicide layer and the second silicide layer causes an enhanced flux divergence region at the second end of the fuse link.

3 Claims, 6 Drawing Sheets

STRUCTURE AND METHOD TO FORM DUAL SILICIDE E-FUSE

BACKGROUND

1. Field of the Invention

The embodiments of the invention generally relate to e-fuse structures and methods, and more particularly to methods and structures for dual silicide e-fuses.

2. Description of the Related Art

E-fuses (electronic fuses) are used in many computerized devices, such as integrated circuits, for a number of purposes, such as array redundancy, field array programming, chip-id trimming, etc. E-fuses have many advantages compared to laser fuses, because they are scalable, less prone to collateral damage, and are field level programmable. The blowing or programming of e-fuses occurs by inducing electro-migration of silicide. After programming, the resistance of the fuse is much higher than before programming.

This electro-migration is determined by a number of factors such as: current density, resistivity, and temperature. One expression of a measure (V) of electro-migration is as follows:

$V \sim J*R*\exp(-Q/kT)/kT$, where J=current density, R=film resistivity, Q=activation energy, and T=temperature.

However, as circuits progress, the programming current requirements are reduced and the power supply voltage and chip area required for programming transistors are minimized. The embodiments described below address such issues.

SUMMARY

This disclosure presents method and structure embodiments that produce current crowding in the fuse link, which allows the e-fuses to be blown using lower voltages/currents. One method of forming an e-fuse structure herein comprises patterning a conductor on a substrate to form an anode, a fuse link, and a cathode, in such a manner that a first end of the fuse link is connected to the anode, and a second end of the fuse link opposite the first end is connected to the cathode. This method silicides the fuse link to form a first silicide layer on the anode and the fuse link, and a second silicide layer different than the first silicide layer on the cathode.

This process produces a number of structure embodiments. One structure embodiment comprises an e-fuse structure that has an anode, a fuse link, and a cathode. The first end of the fuse link is connected to the anode and the second end of the fuse link opposite the first end is connected to the cathode. This structure also includes a first silicide layer on the anode and the fuse link and a second silicide layer, different than the first silicide layer, on the cathode. The difference between the first silicide layer and the second silicide layer causes an enhanced flux divergence region at the second end of the fuse link.

This disclosure presents a method of forming an e-fuse structure comprising patterning a conductor on a substrate to form an anode, a fuse link, and a cathode, in such a manner that a first end of said fuse link is connected to said anode, and a second end of said fuse link opposite said first end is connected to said cathode; forming a diffusion barrier over said anode and said to fuse link; and siliciding said fuse link to form a first silicide layer on said anode and said fuse link and a second silicide layer different than said first silicide layer on said cathode.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
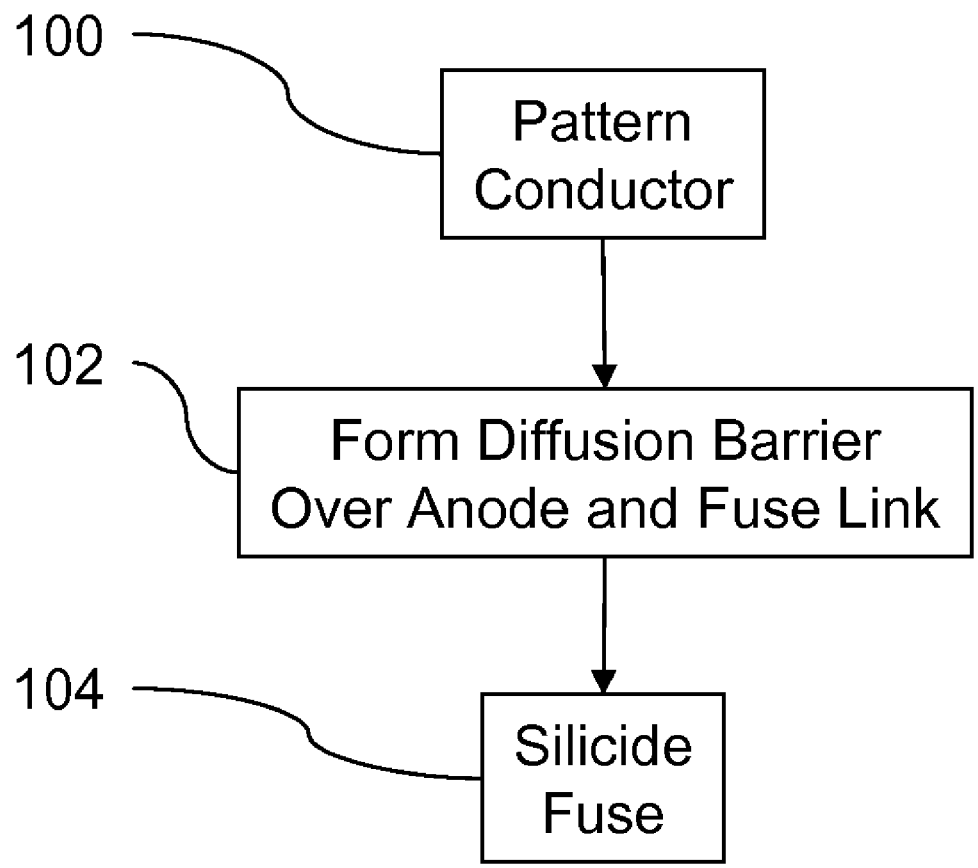
FIG. 1 is a flow diagram illustrating method embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, this disclosure presents method and structure embodiments that produce current crowding in the fuse link, which allows the e-fuses to be blown using lower voltages/currents. As shown in flowchart form in FIG. 1, one method of forming an e-fuse structure comprises patterning a conductor on a substrate to form an anode, a fuse link, and a cathode, in such a manner that a first end of the fuse link is connected to the anode, and a second end of the fuse link opposite the first end is connected to the cathode, as shown in item 100. Next, the method forms a diffusion barrier over the anode and the fuse link, as shown in item 102. This method silicides the fuse structure in item 104. Because of the presence of the diffusion barrier, a first silicide layer is formed on the anode and the fuse link, and a second silicide layer different than the first silicide layer is formed on the cathode in item 104.

Thus, because of the presence of the diffusion barrier, the first silicide layer has a higher electrical resistance than the second silicide layer. One process for forming the different silicide layers can, as explained in greater detail below, include selectively patterning the diffusion barrier over the anode and the fuse link, where the diffusion barrier is not patterned over the cathode. Thus, as shown in greater detail below, before the siliciding, the method can implant an impurity into the anode and the fuse link, without implanting such an impurity (e.g., germanium, xenon, arsenic, etc.) into the cathode to form the diffusion barrier. Alternatively, before the siliciding, the method can form a metal diffusion barrier on the anode and the fuse link, again as described in greater detail below.

Figure 2A:
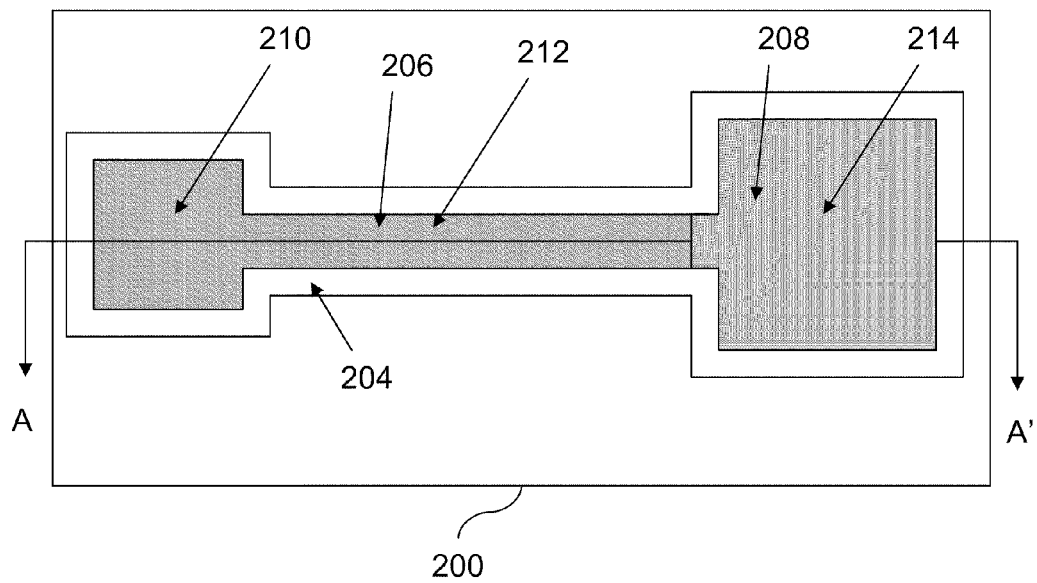
FIG. 2A is a top view of an e-fuse structure according to embodiments herein.
Figure 2B:
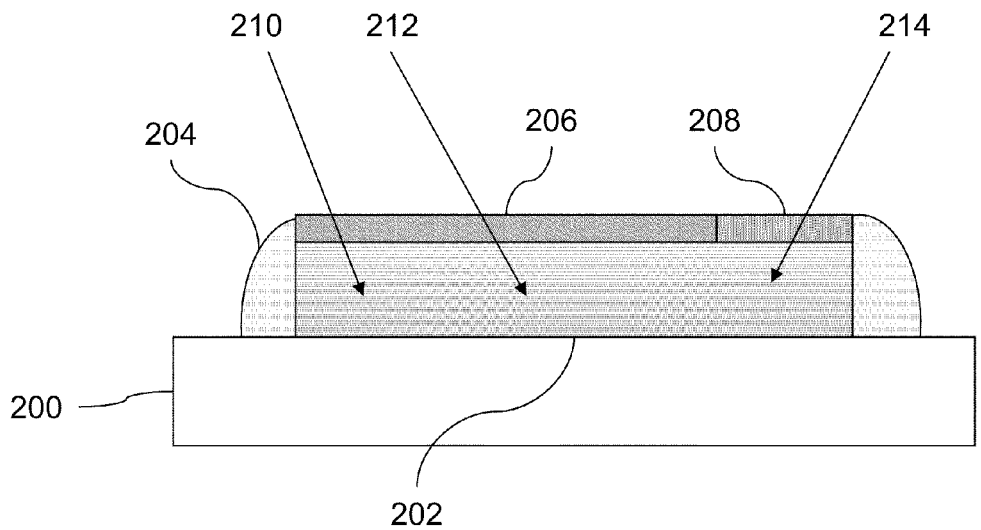
FIG. 2B is a cross-sectional view of an e-fuse structure according to embodiments herein.

This method produces the structure shown in FIGS. 2A and 2B. FIG. 2A illustrates an e-fuse in top (plan) view, while FIG. 2B illustrates the same structure in cross-section along line A-A'. This e-fuse structure that has conductor 202 on an insulator substrate 200. The conductor 202 has different portions, which include the anode 210, the fuse link 212, and the cathode 214. Insulating sidewall spacers 204 are coplanar with and positioned adjacent to the anode 210, the cathode 214, and the fuse link 212. The first end of the fuse link 212 is connected to the anode 210 and the second end of the fuse link 212 opposite the first end is connected to the cathode 214.

This structure also includes a first silicide layer 206 on the anode 210 and the fuse link 212 and a second silicide layer, different than the first silicide layer 206, on the cathode 214 and potentially on a small (e.g., less than 10% by length) portion of the end of the fuse link near the cathode. The first silicide layer 206 can be coplanar with the second silicide layer 208. In some embodiments, a portion of the second end of the fuse link 212 can be covered with the second silicide layer 206 (this is the cathode end portion of the fuse link 212 approximately equal to the width of the spacers 204) as shown in FIG. 2A.

The difference between the first silicide layer 206 and the second silicide layer 208 causes an enhanced flux divergence region at the second end of the fuse link 212. More specifically, the second silicide layer 208 can comprise a greater amount of metal than the first silicide layer 206. Therefore, the first silicide layer 206 has a higher electrical resistance than the second silicide layer 208.

The flowchart in FIG. 1 generally illustrates the method embodiments herein. More specific method embodiments are shown schematically in FIGS. 3A-6B. In FIGS. 3A-6A (the "A" drawings) illustrate an e-fuse in top (plan) view, while FIGS. 3B-6B (the "B" drawings) illustrate the same structure in cross-section along line A-A'.

Figure 3A:
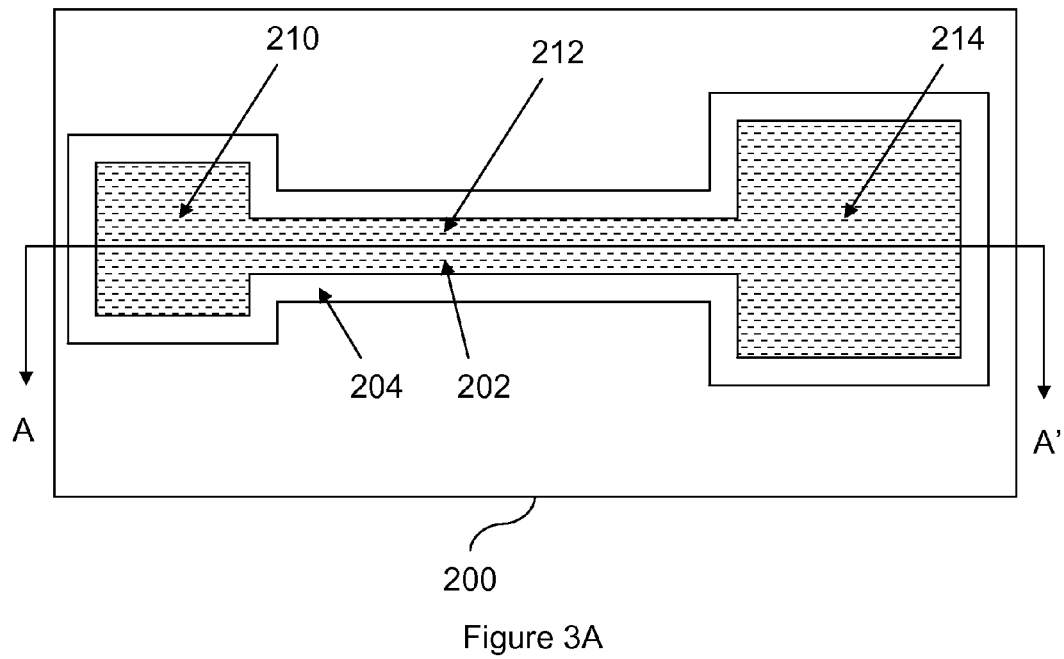
FIG. 3A is a top view of an e-fuse structure according to embodiments herein.
Figure 3B:
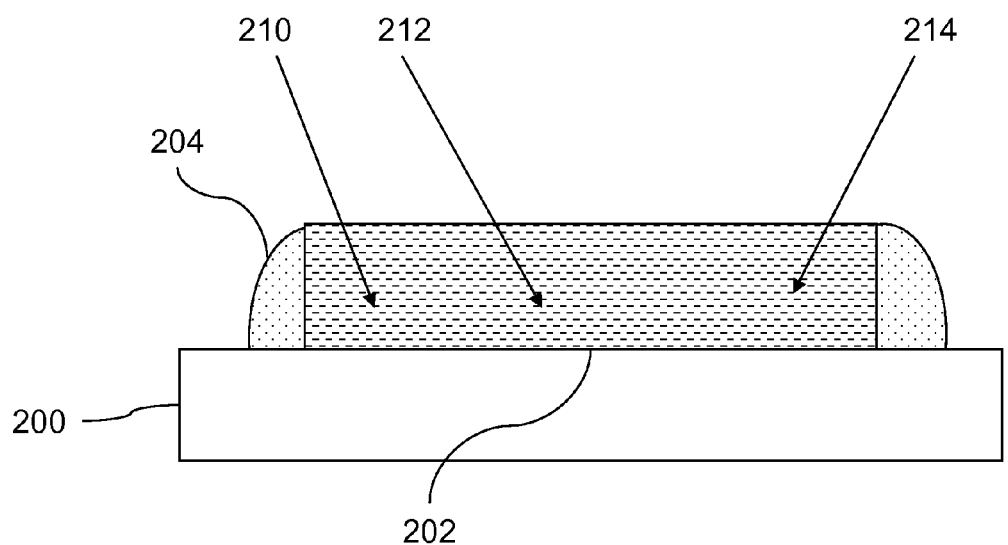
FIG. 3B is a cross-sectional view of an e-fuse structure according to embodiments herein.

FIGS. 3A-6B illustrate a conductor 202 (e.g., polysilicon, or any other conductor whether now know or developed in the future) on a substrate 200 patterned to form an anode 210, a fuse link 212, and a cathode 214. This patterning is performed in such a manner that a first end of the fuse link 212 is connected to the anode 210, and a second end of the fuse link 212 opposite the first end is connected to the cathode 214. Insulating sidewall spacers (e.g., nitride) 204 are also formed using conventional processing. Processes and the materials used for patterning e-fuse conductors, doping, forming sidewall spacers, siliciding, etc. are well known to those ordinarily skilled in the art and are not discussed in detail herein to maintain focus on the salient portions of the invention. For examples of such conventional teachings, see U.S. Patent Publications 2008/0050903 and 2008/0029843, which are fully incorporated herein by reference. The resulting structure is shown in FIGS. 3A-3B.

Figure 4A:
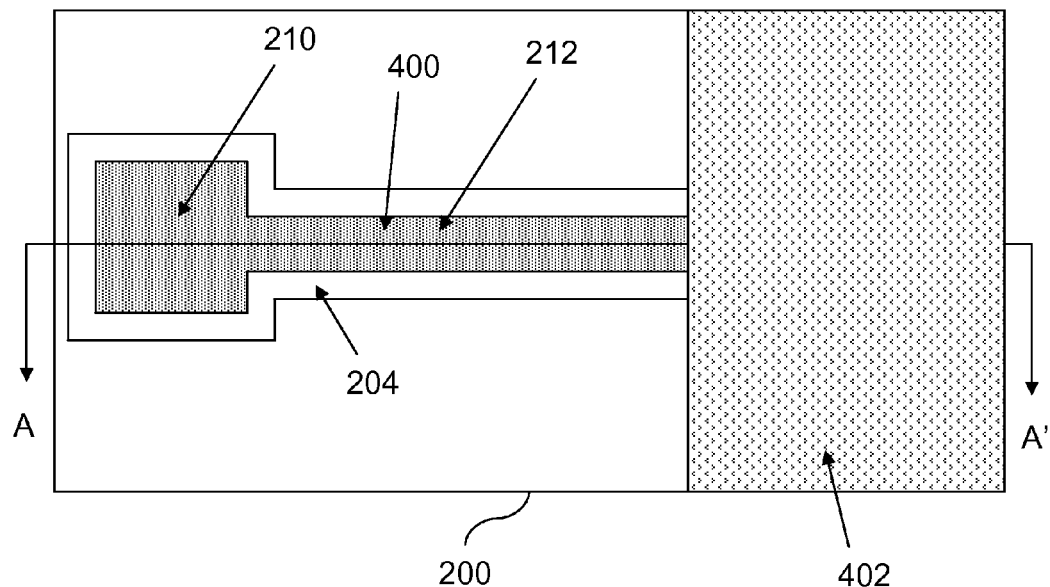
FIG. 4A is a top view of an e-fuse structure according to embodiments herein.
Figure 4B:
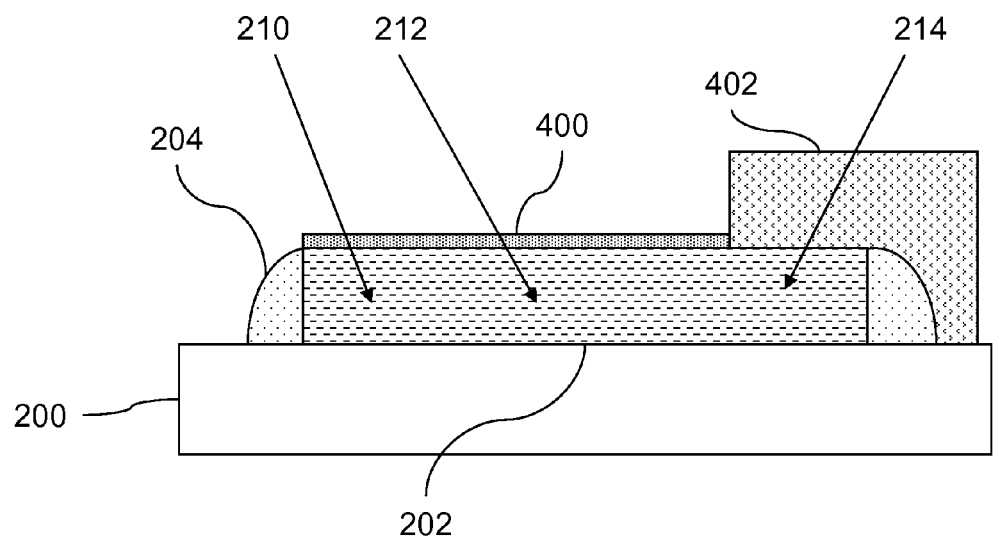
FIG. 4B is a cross-sectional view of an e-fuse structure according to embodiments herein.

In FIGS. 4A-5B, the method selectively patterns (e.g., sputters) a diffusion barrier 400 over the anode 210 and the fuse link 212, using a mask 402 (the diffusion barrier 400 is not patterned over the cathode 414 because of the presence of the mask 402). The diffusion barrier 400 comprises any material that will slow the diffusion of the silicide metal used in the following silicide process. Therefore, if nickel is utilized in the silicide process, an appropriate diffusion barrier would be titanium because titanium would slow the diffusion of the nickel into the silicide. Thus, as shown in FIGS. 4A-4B, the diffusion barrier (such as titanium) 400 is patterned, using conventional patterning techniques, such as those discussed in the previously incorporated conventional teachings.

Figures 5A, 5B:
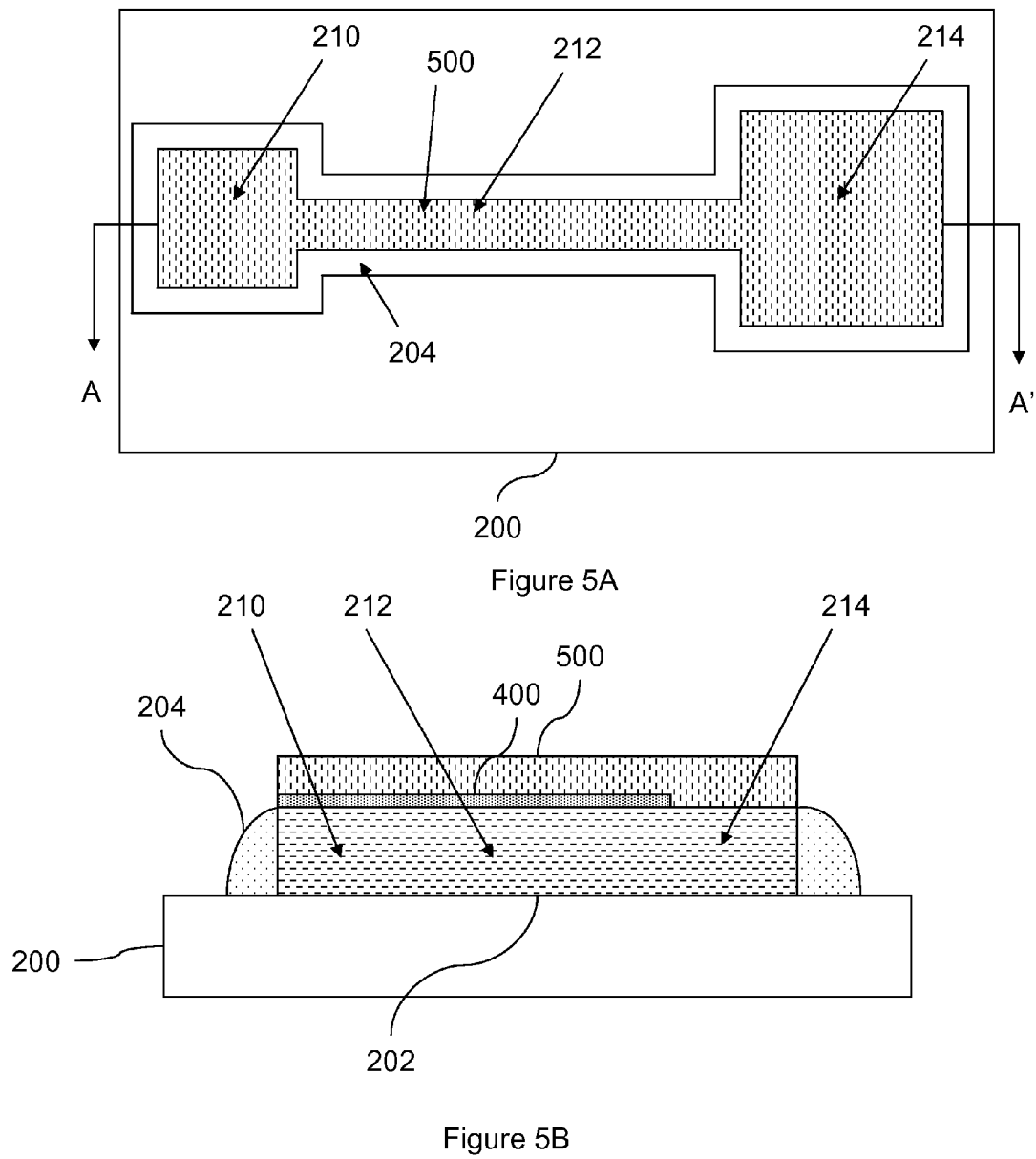
FIG. 5A is a top view of an e-fuse structure according to embodiments herein.
FIG. 5B is a cross-sectional view of an e-fuse structure according to embodiments herein.

Then, as shown in FIG. 5A-5B, the structure is silicided using a different metal 500 than the barrier 400 (such as nickel) to produce the silicide layers 206, 208, mentioned above. During the silicide process, the silicide metal 500 is deposited (e.g., sputtered) over the full width of the fuse structure, and then the structure is heated. Afterwards, any excess barrier metal 400 or silicide metal 500 is removed to eventually result in the structure shown in FIGS. 2A-2B.

In FIGS. 5A-5B, because of the presence of the diffusion barrier 400, less silicon reacts with the metal in the first silicide layer 206 when compared to the second silicide layer 208. Therefore, if for example nickel were utilized as the silicide metal, the first silicide layer 206 could comprise $NiSi_2$ while the second silicide layer 208 could comprise NiSi. Therefore, because less nickel was able to diffuse through to the silicon 202 because of the diffusion barrier 400, less nickel reacted with the silicon in the first silicide layer 206. In this example the first silicide layer 206 ($NiSi_2$) could have only half as much metal as the second silicide layer 208 (NiSi), thereby making the electrical resistivity of the second silicide layer 208 lower than the first silicide layer 206. As discussed in the previously incorporated conventional teachings, siliciding of polysilicon can be accomplished by deposition of nickel, cobalt, tungsten, titanium, tantalum, or other metal capable of reacting with silicon to form a low resistivity, thermally stable silicide, and the diffusion barrier would be correspondingly selected to slow the silicide process of any such metal.

Figure 6A:
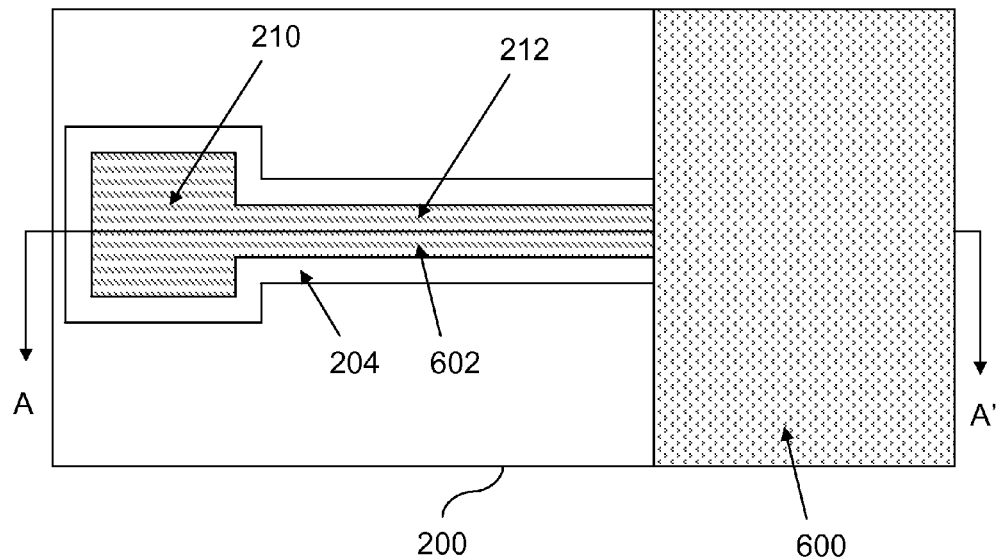
FIG. 6A is a top view of an e-fuse structure according to embodiments herein.
Figure 6B:
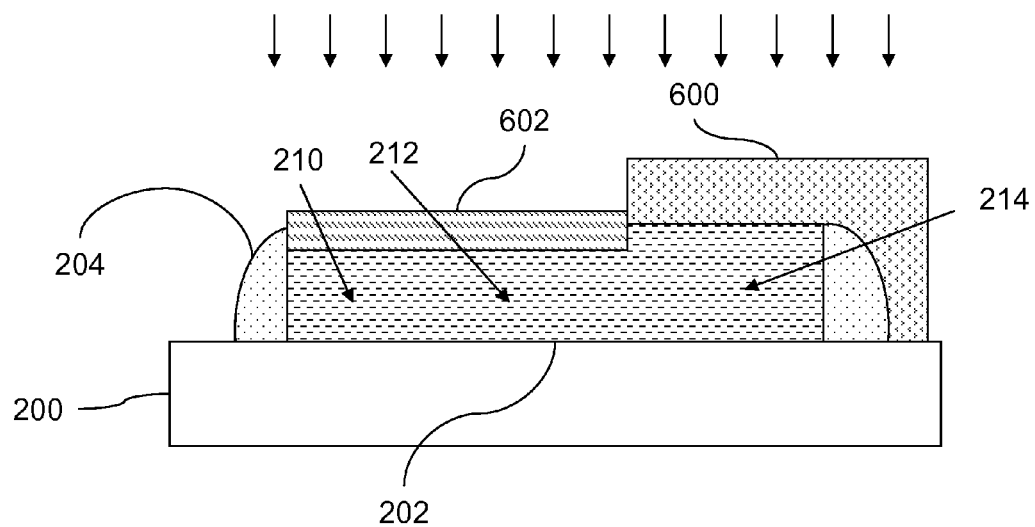
FIG. 6B is a cross-sectional view of an e-fuse structure according to embodiments herein.

In another method embodiment, shown in FIGS. 6A-6B, before the siliciding, the method can implant an impurity (e.g., germanium, xenon, arsenic, etc.) into the anode and the fuse link, without implanting such an impurity into the cathode. More specifically, beginning with the structure shown in FIGS. 3A-3B, in FIGS. 6A-6B, the method implants an impurity only into the regions of the conductor 202 where the anode 212 and the fuse link 212 will be, using a mask 600 to protect the cathode 214. The impurity can comprise germanium, xenon, arsenic, etc. and the silicide can comprise any silicide of nickel, cobalt, tungsten, titanium, tantalum, or other metal capable of reacting with silicon. Processes and the materials used for doping are well known to those ordinarily skilled in the art and are not discussed in detail herein to maintain focus on the salient portions of the invention. For an example of such conventional teachings, see U.S. Pat. No. 7,244,958, which is fully incorporated herein by reference.

This implant creates a pre-amprophized impurity region 602 in the conductor 202. The method then suicides the structure shown in FIGS. 6A-6B using the processes discussed above to form the structure shown in FIGS. 2A-2B. The impurity region 602 similarly acts as a diffusion barrier and limits the amount of silicide metal that will react with the silicon 202. Therefore, this process also makes the resistivity of the first silicide layer 206 higher than in the second silicide layer 208.

Therefore, the embodiments herein allow a programmed e-fuse to have a higher resistance (because of the different silicide regions), which allows the e-fuses to be programming with a smaller amount of energy (current/voltage). This reduces voltage requirements and also reduces the likelihood that the fuse link will rupture during programming.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. An e-fuse structure comprising:
    an anode;
    a fuse link, a first end of said fuse link being connected to said anode;
    a cathode, a second end of said fuse link opposite said first end being connected to said cathode;
    a first silicide layer on said anode and said fuse link; and
    a second silicide layer different than said first silicide layer on said cathode and on a portion of said fuse link proximate said second end of said fuse link,
    a difference between said first silicide layer and said second silicide layer causing an enhanced flux divergence region at a small portion of said second end of said fuse link near said cathode.

2. The e-fuse structure according to claim 1, said first silicide layer having a higher electrical resistance than said second silicide layer.

3. The e-fuse structure according to claim 1, said first silicide layer being coplanar with said second silicide layer.

* * * * *